(12) United States Patent
Liang et al.

(10) Patent No.: US 10,424,610 B2
(45) Date of Patent: Sep. 24, 2019

(54) CAPACITOR, IMAGE SENSOR CIRCUIT AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Xin Liang, Shanghai (CN); Chong Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/849,265

(22) Filed: Dec. 20, 2017

(65) Prior Publication Data

US 2018/0182791 A1    Jun. 28, 2018

(30) Foreign Application Priority Data

Dec. 22, 2016  (CN) .......................... 2016 1 1198711

(51) Int. Cl.
*H01L 27/146*  (2006.01)
*H01L 29/66*  (2006.01)
(Continued)

(52) U.S. Cl.
CPC ......... *H01L 27/1463* (2013.01); *H01G 9/048* (2013.01); *H01G 9/07* (2013.01);
(Continued)

(58) Field of Classification Search
CPC ................. H01L 21/0332; H01L 28/90; H01L 29/14609; H01L 29/66181
See application file for complete search history.

(56) References Cited

U.S. PATENT DOCUMENTS

2005/0215061 A1* 9/2005 Wu ..................... H01L 21/0332
                                                                 438/702
2006/0057814 A1* 3/2006 Weis ................... H01L 27/1087
                                                                 438/386
(Continued)

FOREIGN PATENT DOCUMENTS

JP            S62298132 A     12/1987

OTHER PUBLICATIONS

The European Patent Office (EPO) The Extended European Search Report for 17207544.2 dated May 18, 2018 14 Pages.

*Primary Examiner* — Daniel P Shook
(74) *Attorney, Agent, or Firm* — Anova Law Group, PLLC (57) ABSTRACT

A capacitor, an image sensor circuit and fabricating methods are provided. The method includes providing a base substrate including a trench region and a body region adjacent to the trench region. The method also includes forming a first trench structure and a second trench structure on the first trench structure, in the base substrate in the trench region. In addition, the method includes forming a dielectric layer on a sidewall surface and a bottom surface of the first trench structure and an electrode layer on the dielectric layer in the first trench structure. Further, the method includes forming an isolation layer filling the second trench structure.

19 Claims, 6 Drawing Sheets

(51) Int. Cl.
*H01L 29/94* (2006.01)
*H01G 9/048* (2006.01)
*H01G 9/07* (2006.01)
*H01L 21/762* (2006.01)
*H01L 49/02* (2006.01)

(52) U.S. Cl.
CPC ...... *H01L 21/762* (2013.01); *H01L 21/76224* (2013.01); *H01L 27/14683* (2013.01); *H01L 29/66181* (2013.01); *H01L 29/945* (2013.01); H01L 27/14609 (2013.01); H01L 28/90 (2013.01)

(56) References Cited

U.S. PATENT DOCUMENTS

| | | | |
|---|---|---|---|
| 2006/0124982 A1 | 6/2006 | Ho et al. | |
| 2008/0283890 A1* | 11/2008 | Dyer | H01L 27/1087 257/301 |
| 2011/0133310 A1* | 6/2011 | Anderson | H01L 21/76224 257/532 |

* cited by examiner

CAPACITOR, IMAGE SENSOR CIRCUIT AND FABRICATION METHODS THEREOF

CROSS-REFERENCES TO RELATED APPLICATIONS

This application claims the priority of Chinese patent application No. 201611198711.X, filed on Dec. 22, 2016, the entirety of which is incorporated herein by reference.

FIELD OF THE DISCLOSURE

The present disclosure generally relates to the field of semiconductor manufacturing and, more particularly, relates to a capacitor, image sensor circuit and fabrication methods thereof.

BACKGROUND

An image sensor is a device that converts optical information into electrical information. At present, the image sensor mainly includes a charge coupled device (CCD) image sensor and a complementary metal-oxide semiconductor (CMOS) image sensor. Compared to the CCD image sensor, the CMOS image sensor (CIS) has wider applications. A CMOS image sensor circuit includes photosensitive components, transistors, capacitors and other structures.

However, the electrical performance of the conventional capacitor is poor and needs to be improved. The disclosed devices, circuits, and methods are directed to solve one or more problems set forth above and other problems in the art.

BRIEF SUMMARY OF THE DISCLOSURE

One aspect of the present disclosure includes a method for fabricating a capacitor. The method includes providing a base substrate including a trench region and a body region adjacent to the trench region. The method also includes forming a first trench structure and a second trench structure on the first trench structure, in the base substrate in the trench region. In addition, the method includes forming a dielectric layer on a sidewall surface and a bottom surface of the first trench structure and an electrode layer on the dielectric layer in the first trench structure. Further, the method includes forming an isolation layer filling the second trench structure.

Another aspect of the present disclosure includes a method for fabricating an image sensor circuit. The method includes forming a capacitor. A method for forming the capacitor includes providing a base substrate including a trench region and a body region adjacent to the trench region. The method for forming the capacitor also includes forming a first trench structure and a second trench structure on the first trench structure, in the base substrate in the trench region. In addition, the method for forming the capacitor includes forming a dielectric layer on a sidewall surface and a bottom surface of the first trench structure and an electrode layer on the dielectric layer in the first trench structure. Further, the method for forming the capacitor includes forming an isolation layer filling the second trench structure.

Another aspect of the present disclosure includes a capacitor. The capacitor includes a base substrate including a trench region and a body region adjacent to the trench region. The capacitor also includes a first trench structure and a second trench structure on the first trench structure, in the base substrate in the trench region. In addition, the capacitor includes a dielectric layer on a sidewall surface and a bottom surface of the first trench structure and an electrode layer on the dielectric layer in the first trench structure. Further, the capacitor includes an isolation layer filling the second trench structure and on the dielectric layer and the electrode layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
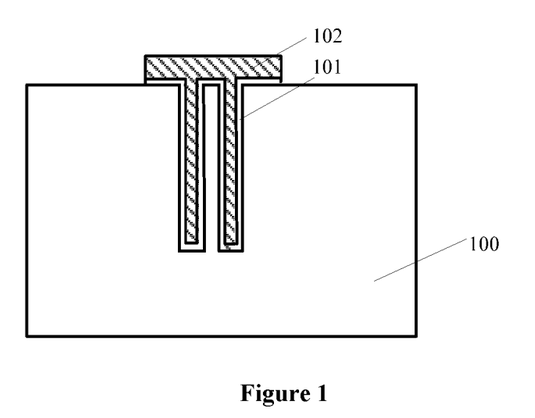
FIG. 1 illustrates a schematic diagram of a capacitor in an image sensor.

FIG. 1 illustrates a schematic diagram of a capacitor in an image sensor. Referring to FIG. 1, the capacitor includes a semiconductor substrate 100. The semiconductor substrate 100 includes a trench region and a body region adjacent to the trench region. Trenches are formed in the semiconductor substrate 100 in the trench region. The capacitor also includes a dielectric layer 101 and a conductive layer 102, formed in the trenches and on portions of the semiconductor substrate 100. The dielectric layer 101 is formed on the sidewalls and at the bottom of the trenches, and on portions of the semiconductor substrate 100. The conductive layer 102 is formed on the dielectric layer 101 and filling the trenches. The conductive layer 102, the semiconductor substrate 100, and the dielectric layer 101 between them constitute the capacitor.

In the above capacitor, the conductive layer 102 is above the surface of the semiconductor substrate 100 in the body region, and portions of the conductive layer 102 is exposed outside of the trenches. When performing other processes, the conductive layer 102 is subjected to etching loss, thereby the electrical performance of the capacitor degrades.

For example, a method for forming a gate structure on the semiconductor substrate includes: forming a gate structure material layer on the semiconductor substrate in the trench region and in the body region; forming a planarization layer on the gate structure material layer; forming a patterned photoresist layer on the planarization layer; etching the gate structure material layer and the planarization layer on the semiconductor substrate in the trench region and in the body region by using the patterned photoresist layer as an etch mask to form the gate structure in the body region and to remove the gate structure material layer on the semiconductor substrate in the body region; and removing the planarization layer and the patterned photoresist layer.

Because the conductive layer is above the surface of the semiconductor substrate in the body region, the gate structure material layer in the trench region is above the gate structure material layer in the body region. When etching the gate structure material layer and the planarization layer on the semiconductor substrate in the trench region and in the body region, the gate structure material layer on the semiconductor substrate in the trench region may be first exposed. When removing the gate structure material layer on the semiconductor substrate in the trench region, only portions of a height of the gate structure material layer on the semiconductor substrate in the body region is etched, or the gate structure material layer on the semiconductor substrate in the body region is not exposed. After forming the gate structure, the conductive layer is subjected to etching loss, thereby the electrical performance of the capacitor degrades.

Figure 8:
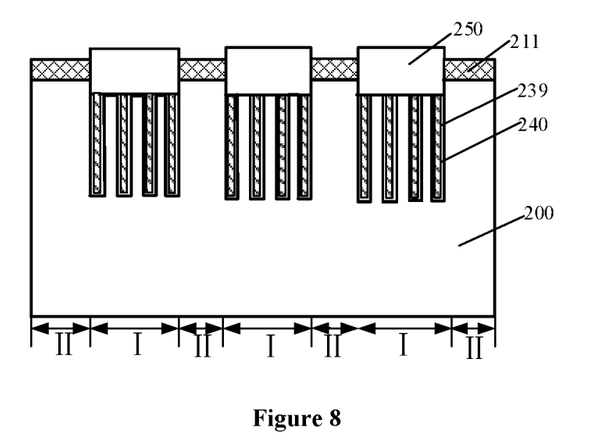
Figure 9:
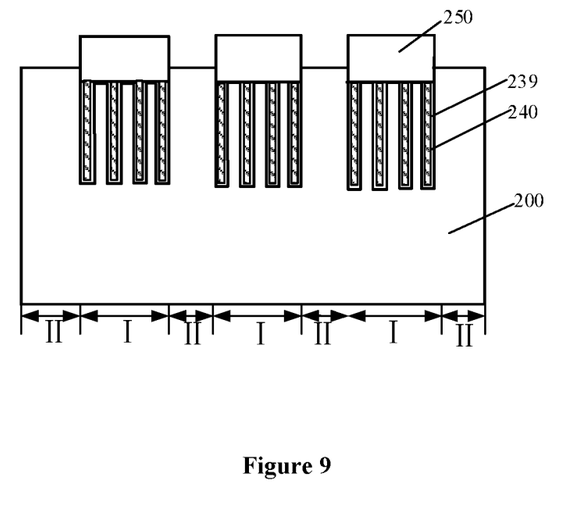
Figure 10:
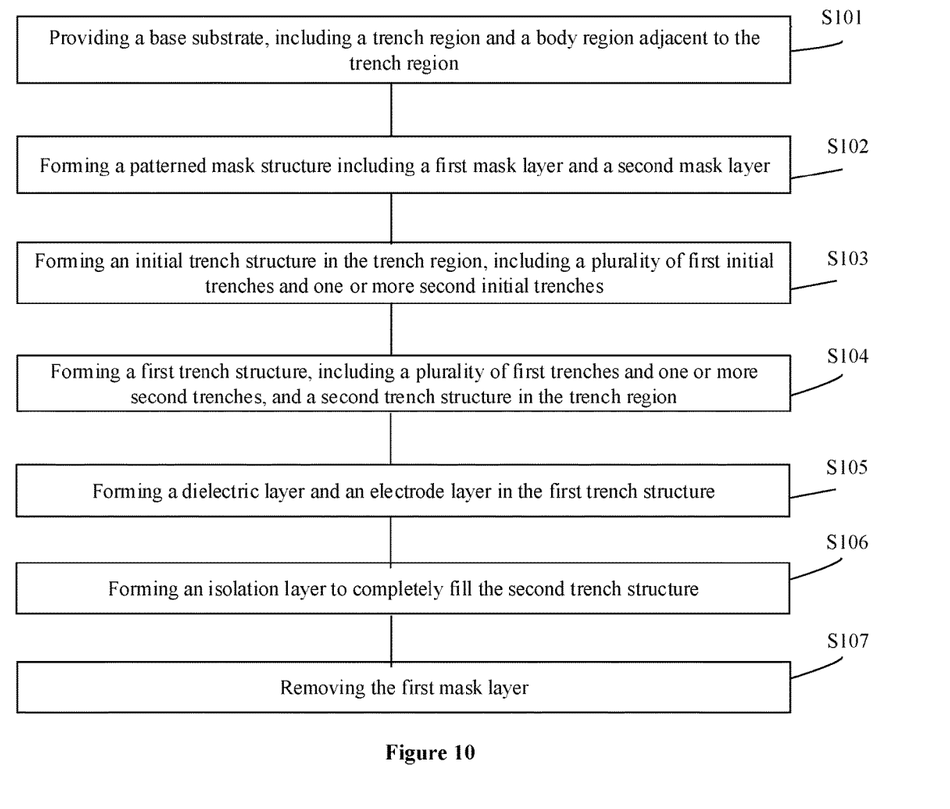
FIG. 10 illustrates an exemplary fabrication method for forming a capacitor consistent with various disclosed embodiments of the present disclosure.

The present disclosure provides a capacitor and fabrication methods thereof. FIG. 10 illustrates an exemplary fabrication method for forming a capacitor consistent with various disclosed embodiments of the present disclosure; and FIGS. 2-9 illustrate semiconductor structures corresponding to certain stages of the exemplary fabrication method.

Figure 2:
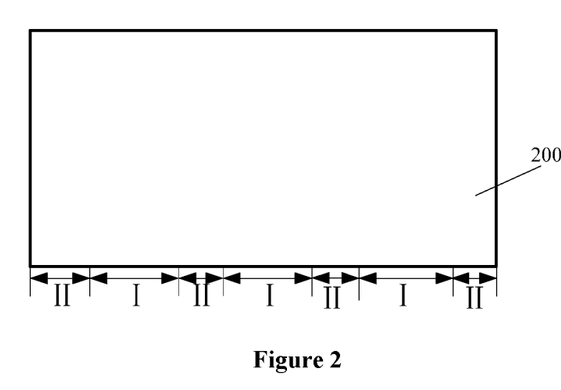
FIGS. 2-9 illustrate semiconductor structures corresponding to certain stages for forming an exemplary capacitor consistent with various disclosed embodiments of the present disclosure.

As shown in FIG. 10, at the beginning of the fabrication method, a base substrate with certain structures may be provided (S101). FIG. 2 illustrates a corresponding semiconductor structure.

Referring to FIG. 2, a base substrate 200 may be provided. The base substrate 200 may include a trench region I and a body region II adjacent to the trench region I. The base substrate in the trench region I may be used to form a first trench structure and a second trench structure.

In one embodiment, the base substrate 200 may be made of monocrystalline silicon. In another embodiment, the base substrate may be made of polysilicon or amorphous silicon. In certain embodiments, the base substrate may be made of germanium, silicon germanium, or gallium arsenide and other semiconductor materials.

In one embodiment, the surface of the base substrate 200 may have a first direction and a second direction intersecting the first direction. The first direction may be adapted to define a length direction of a subsequently formed first trench, and the second direction may be adapted to define a length direction of a subsequently formed second trench. In one embodiment, the first direction may be perpendicular to the second direction. In certain embodiments, the angle between the first direction and the second direction may be an acute angle or an obtuse angle.

Then, the first trench structure and the second trench structure on the first trench structure may be formed in the base substrate 200 in the trench region I.

Figure 3:
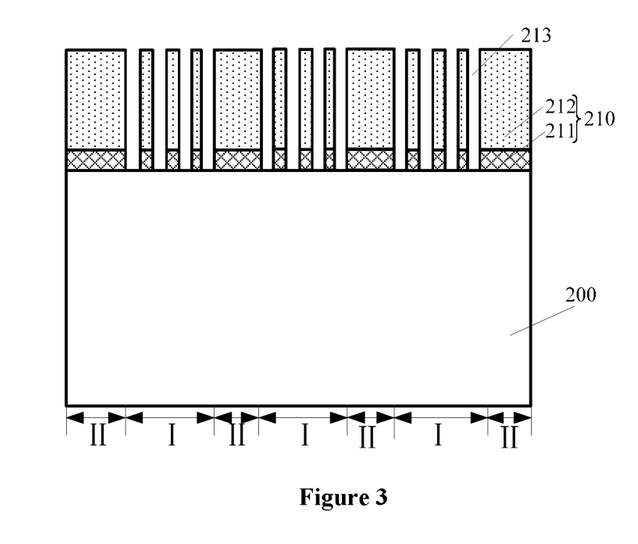
Figure 4:
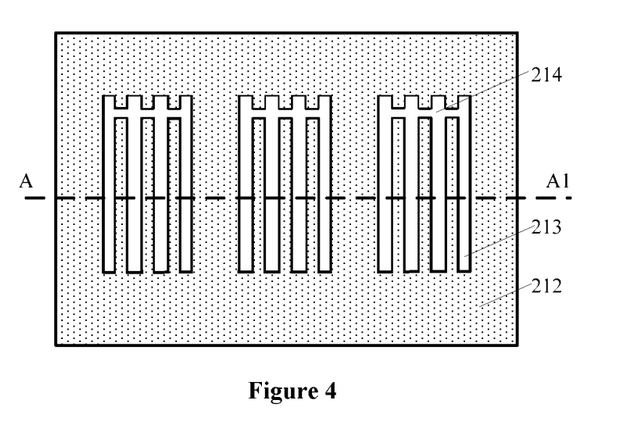

Returning to FIG. 10, after forming the base substrate, a patterned mask structure may be formed (S102). FIGS. 3-4 illustrate a corresponding semiconductor structure.

FIG. 4 illustrates a top-view facing toward a patterned mask structure 210 on the basis of FIG. 3, and FIG. 3 illustrates a cross-sectional view along a line 'AA1' in FIG. 4. Referring to FIGS. 3-4, a patterned mask structure 210 may be formed on the base substrate 200. The patterned mask structure 210 may cover the base substrate 200 in the body region II and may expose portions of the base substrate 200 in the trench region I.

The patterned mask structure 210 may include a mask opening structure. The mask opening structure may expose portions of the base substrate 200 in the trench region I. In one embodiment, the mask opening structure may include a plurality of first mask openings 213, and one or more second mask openings 214 in a direction parallel to the surface of the base substrate 200. The second mask openings 214 may penetrate through the first mask openings 213, respectively. A length direction of the first mask openings 213 may be parallel to the first direction, and a length direction of the second mask openings 214 may be parallel to the second direction, perpendicular to the first direction. The mask opening structure may be used to define the position of a subsequently formed initial trench structure. The first mask openings 213 may be used to define subsequently formed first initial trenches, and the second mask openings 214 may be used to define subsequently formed second initial trenches. Correspondingly, the number of the subsequently formed first initial trenches may be more than one, and the number of the subsequently formed second initial trenches may be one or more.

In certain embodiments, the mask opening structure may include one first mask opening in the direction parallel to the surface of the base substrate 200. Correspondingly, a subsequently formed first trench structure may include one first trench. The exemplary single first mask opening may be used to define a subsequently formed single first trench.

In one embodiment, the patterned mask structure 210 may be a stacked structure. The patterned mask structure 210 may include a first mask layer 211 formed on the base substrate 200 in the body region II and on portions of the base substrate 200 in the trench region I, and a second mask layer 212 formed on the first mask layer 211.

In one embodiment, the first mask layer 211 may be made of silicon nitride, silicon oxide, or silicon oxynitride, etc. The second mask layer 212 may be made of silicon nitride, silicon oxide, or silicon oxynitride, etc. The second mask layer 212 may be made of a material different from the first mask layer 211. When subsequently removing the second mask layer 212, the second mask layer 212 may have a higher etching selection rate over the first mask layer 211.

A method for forming the mask structure 210 may include: forming a first initial mask layer on the base substrate 200; forming a second initial mask layer on the first initial mask layer; and forming a third initial mask layer on the second initial mask layer. The method may also include: forming a patterned photoresist layer on the third initial mask layer; and etching the third initial mask layer by using the patterned photoresist layer as an etch mask to form a third mask layer from the third initial mask layer. The third mask layer may include a third opening. Further, the method may include etching the second initial mask layer and the first initial mask layer at the bottom of the third opening by using the patterned photoresist layer and the third mask layer as an etch mask, to form the second mask layer 212 from the second initial mask layer and the first mask layer 211 from the first initial mask layer. The second mask layer may include the second mask opening, and the first mask layer may include the first mask openings. The first mask openings and the second mask opening may form the mask opening structure.

In one embodiment, when etching the second initial mask layer and the first initial mask layer at the bottom of the third opening, the third mask layer and the patterned photoresist layer may be totally consumed and thus removed. In certain embodiments, after etching the second initial mask layer and the first initial mask layer at the bottom of the third opening, the third mask layer and the patterned photoresist layer may be retained. Then, the remaining third mask layer and the patterned photoresist layer may need to be removed, e.g., by an etching process. Alternatively, after etching the second initial mask layer and the first initial mask layer at the bottom of the third opening, the third mask layer may be retained. The third mask layer may be subsequently removed when removing the second mask layer.

In one embodiment, the third mask layer may be made of silicon, germanium, or germanium silicon, etc. The silicon, germanium, or germanium silicon may be in the form of polycrystalline or amorphous.

The hardness of the third mask layer may be larger than the hardness of the second initial mask layer and the first initial mask layer. When etching the second initial mask layer and the first initial mask layer at the bottom of the third opening by using the third mask layer as an etch mask, etching loss of the third mask layer may be small and morphology of the sidewall of the third mask layer may be as desired. Correspondingly, morphology of the sidewall of the mask opening structure may be obtained as desired.

In certain embodiments, the patterned mask structure may be a single-layer structure. The patterned mask structure may be made of silicon nitride, silicon oxide, silicon oxynitride, silicon, germanium or germanium silicon, etc. The silicon, germanium, or germanium silicon may be in the form of polycrystalline or amorphous.

In one embodiment, an interface layer may be formed between the patterned mask structure and the base substrate 200. The interface layer may be made of silicon oxide. A process for forming the interface layer may include an oxidation process. The interface layer may protect the base substrate 200 from etching damages when subsequently removing the first mask layer 211. When the first mask layer 211 is made of silicon nitride, the interface layer may be formed between the first mask layer 211 and the base substrate. The interface layer may serve as a stress buffer layer.

Figure 5:
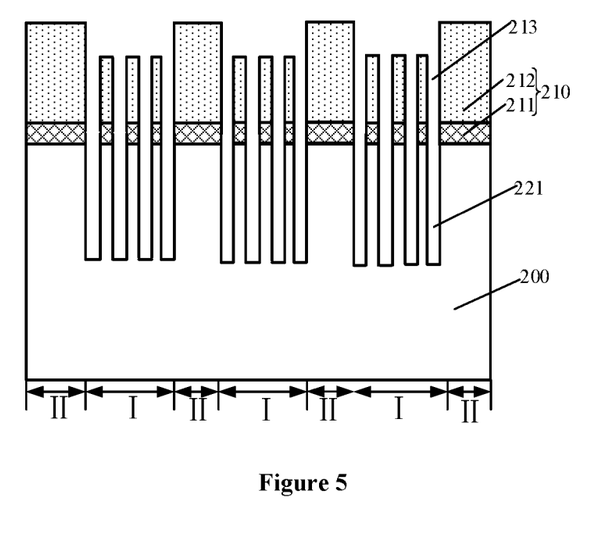

Returning to FIG. 10, after forming the mask opening structure, an initial trench structure may be formed (S103). FIG. 5 illustrates a corresponding semiconductor structure.

Referring to FIG. 5, an initial trench structure may be formed in the base substrate 200 in the trench region I by etching the base substrate 200 in the trench region I at the bottom of the mask opening structure using the patterned mask structure 210 as an etch mask. The initial trench structure may include a plurality of first initial trenches 221 and one or more second initial trenches (not illustrated). The second initial trenches may penetrate through the first initial trenches 221, respectively, in a direction parallel to the top surface of the base substrate 200.

In one embodiment, a length direction of the first initial trenches 221 may be parallel to the first direction, and a length direction of the second initial trenches may be parallel to the second direction. The first direction and the second direction may be across with each other, e.g., may be perpendicular with each other.

In one embodiment, a distance between the adjacent first initial trenches may be in a range of approximately 0.1 µm-0.6 µm. If the distance between the adjacent first initial trenches is greater, such as greater than 0.6 µm, the total area of the first initial trenches 221 in the initial trench structure may become small, lowering the integration of capacitors. If the distance between the adjacent first initial trenches is smaller than 0.1 µm, the base substrate 200 in the trench region I between the adjacent first initial trenches 221 may be too thin. As a result, when forming the first initial trenches 221, the base substrate 200 in the trench region I between the adjacent first initial trenches 221 may be easily broken and dumped.

In one embodiment, a process for forming the initial trench structure by etching the base substrate 200 in the trench region I may include an anisotropic dry etching process. Parameters of the anisotropic dry etching process may include the following. Gases may include He, HBr, $NF_3$, $O_2$, $HeO_2$, $SiF_4$ and Ar, He flow rate may be in a range of approximately 10 sccm-22 sccm, HBr flow rate may be in a range of approximately 150 sccm-230 sccm, $NF_3$ flow rate may be in a range of approximately 20 sccm-40 sccm, $O_2$ flow rate may be in a range of approximately 4 sccm-30 sccm, $HeO_2$ flow rate may be in a range of approximately 90 sccm-100 sccm, $SiF_4$ flow rate may be in a range of approximately 7 sccm-10 sccm, Ar flow rate may be in a range of approximately 100 sccm-200 sccm, a source RF power may be in a range of approximately 200 watts-1000 watts, a bias RF power may be in a range of approximately 300 watts-1200 watts, and a chamber pressure may be in a range of approximately 80 mtorr-250 mtorr.

When forming the initial trench structure by etching the base substrate 200 in the trench region I, the gases may include $NF_3$. The plasma formed by the $NF_3$ may react with the base substrate 200 to form a polymerization by-product. The polymerization by-product may be easily adsorbed on the sidewall of the initial trench structure. The polymerization by-product may protect the sidewall of the initial trench structure from large etching loss.

In one embodiment, the initial trench structure may be formed by etching the base substrate 200 in the trench region I using the above-described parameters, such that the verticality between the sidewall of the initial trench structure and the top surface of the base substrate may be high.

In one embodiment, when etching the base substrate 200 in the trench region I, the interface layer in the trench region I may also be etched. Correspondingly, the initial trench structure may also penetrate through the interface layer.

The area of the patterned mask structure 210 between the adjacent first mask openings 213, and between the adjacent first mask opening 213 and the second mask opening 214 may be small. The patterned mask structure 210 between the first mask opening 213 and an adjacent second mask opening 214 may be referred to a corner area including an intersection where the first mask opening 213 and the adjacent second mask opening intersect, along with surrounding areas of the intersection. Thus the etching loss of the patterned mask structure 210 in the trench region I may be large. After forming the initial trench structure, the top surface of the patterned mask structure 210 in the trench region I may be lower than the top surface of the patterned mask structure 210 in the body region II.

Figure 6:
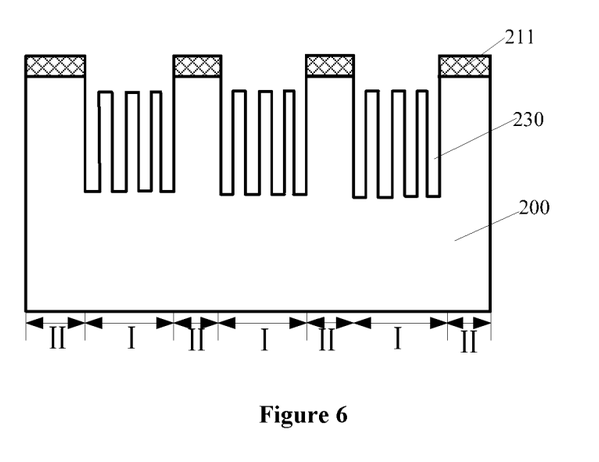

Returning to FIG. 10, after forming the initial trench structure, a first trench structure and a second trench structure may be formed (S104). FIG. 6 illustrates a corresponding semiconductor structure.

Referring to FIG. 6, a first trench structure and a second trench structure may be formed by removing portions of the base substrate 200 in the trench region I along the direction perpendicular to the top surface of the base substrate 200. In one embodiment, portions of the base substrate 200 in the trench region I between the adjacent first initial trenches 221 (illustrated in FIG. 5) and between the first initial trench 221 and the second initial trench may be removed along the direction perpendicular to the top surface of the base substrate 200. The base substrate between the first initial trench 221 and an adjacent second initial trench may be referred to a corner area including an intersection where the first initial trench 221 and the adjacent second initial trench intersect, along with surrounding areas of the intersection. The second trench structure may be formed on the first trench structure.

In one embodiment, the first trench structure may include a plurality of first trenches 230, and one or more second trenches. The second trenches may penetrate the first trenches 230, respectively, along a direction parallel to the top surface of the base substrate 200. A length direction of the first trenches 230 may be parallel to the first direction, and a length direction of the second trenches may be parallel to the second direction.

In one embodiment, after removing portions of the base substrate 200 in the trench region I between the adjacent first initial trenches 221 and between the first initial trench 221 and the second initial trench, the top surface of the base substrate 200 in the trench region I between the adjacent first initial trenches 221 and between the first initial trench 221 and the second initial trench may be lower than the top surface of the base substrate 200 in the body region II.

In one embodiment, when removing portions of the base substrate 200 in the trench region I between the adjacent first initial trenches 221 and between the first initial trench 221 and the second initial trench, the first mask layer 211 and the second mask layer 212 on the base substrate 200 in the trench region I, and the second mask layer 212 on the base substrate 200 in the body region II may be removed.

A process for removing portions of the base substrate 200 in the trench region I between the adjacent first initial trenches 221 and between the first initial trench 221 and the second initial trench may include an etching process, such as a dry etching process and/or a wet etching process. In one embodiment, the process for removing portions of the base substrate 200 in the trench region I between the adjacent first initial trenches 221 and between the first initial trench 221 and the second initial trench may include the dry etching process. Parameters of the dry etching process may include the following. Gases may include $C_4F_8$, $CHF_3$, $C_4F_6$, $O_2$, Ar and CO, $C_4F_8$ flow rate may be in a range of approximately 50 sccm-100 sccm, $CHF_3$ flow rate may be in a range of approximately 50 sccm-200 sccm, $C_4F_6$ flow rate may be in a range of approximately 30 sccm-80 sccm, $O_2$ flow rate may be in a range of approximately 10 sccm-30 sccm, Ar flow rate may be in a range of approximately 500 sccm-1000 sccm, CO flow rate may be in a range of approximately 300 sccm-800 sccm, a chamber pressure may be in a range of approximately 30 mtorr-70 mtorr, and a bias RF power may be in a range of approximately 800 watts-2000 watts.

After forming the first trench structure and the second trench structure, the first mask layer 211 may be retained on the top surface of the base substrate 200 in the body region II. In certain embodiments, when removing portions of the base substrate in the trench region between the adjacent first initial trenches and between the first initial trench and the second initial trench, the patterned mask structure on the base substrate in the trench region and in the body region may be removed.

In certain embodiments, after forming the initial trench structure, the patterned mask structure on the base substrate in the trench region and in the body region may be removed. Then, portions of the base substrate in the trench region between the adjacent first initial trenches and between the first initial trench and the second initial trench may be removed.

When the first trench structure includes one first trench, a method for forming the first trench structure and the second trench structure may include: forming a patterned mask layer, where the patterned mask layer may cover the base substrate in the body region and may expose the base substrate in the trench region; performing an anisotropic etching process on the base substrate in the trench region by using the patterned mask layer as a mask to form the first trench structure and the second trench structure on the first trench structure; and removing the patterned mask layer.

Figure 7:
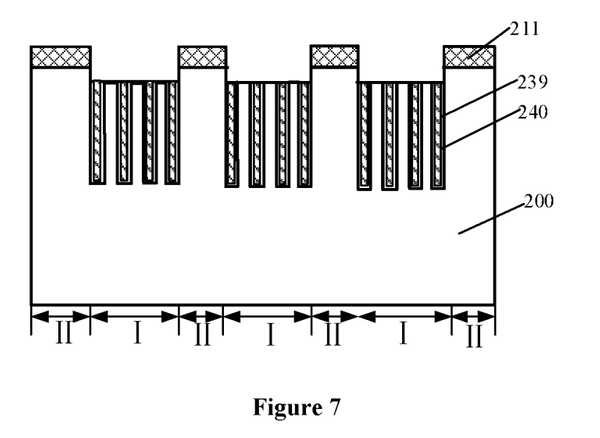

Returning to FIG. 10, after forming the first trench structure and the second trench structure, an electrode layer may be formed (S105). FIG. 7 illustrates a corresponding semiconductor structure.

Referring to FIG. 7, a dielectric layer 239 may be formed in the first trench structure, and an electrode layer 240 may be formed on the dielectric layer. The dielectric layer may be formed on the sidewall surface and bottom surface of the first trench structure. The dielectric layer 239 may be made of silicon oxide, or silicon nitride, etc. The electrode layer 240 may be made of polysilicon.

A method for forming the dielectric layer and the electrode layer 240 may include: forming the dielectric layer on the sidewall surface and bottom surface of the first trench structure; forming an initial electrode layer (not illustrated) on the dielectric layer and on the base substrate 200, where the initial electrode layer may be formed in the first trench structure and in the second trench structure; and removing the initial electrode layer on the base substrate 200 and in the second trench structure to form the electrode layer 240. In one embodiment, the dielectric layer may also be formed on the sidewall of the second trench structure.

A process for forming the dielectric layer may include an oxidation process. A process for forming the initial electrode layer may include a deposition process, such as a high density plasma chemical vapor deposition process, a high aspect ratio deposition process, or a plasma enhanced chemical vapor deposition process, etc. A process for removing the initial electrode layer on the base substrate 200 and in the second trench structure may include a back-etching process.

When removing the initial electrode layer on the base substrate 200 and in the second trench structure, the first mask layer 211 may protect the top surface of the base substrate 200 from etching loss.

Returning to FIG. 10, after forming the electrode layer, an isolation layer may be formed (S106). FIG. 8 illustrates a corresponding semiconductor structure.

Referring to FIG. 8, after forming the dielectric layer 239 and the electrode layer 240, an isolation layer 250 may be formed to fill the second trench structure. In one embodiment, the isolation layer 250 may be made of silicon oxide.

A method for forming the isolation layer 250 may include: forming an initial isolation layer in the second trench structure and on the base substrate in the body region II; and removing the initial isolation layer on the base substrate 200 in the body region II to form the isolation layer 250.

In one embodiment, the initial isolation layer may be formed in the second trench structure and on the first mask layer 211. The initial isolation layer on the first mask layer 211 may be removed to form the isolation layer 250.

In one embodiment, the top surface of the isolation layer 250 may be above the top surface of the base substrate 200 in the body region II. In certain embodiments, the top surface of the isolation layer may be coplanar with the top surface of the base substrate in the body region.

A process for forming the initial isolation layer may include a deposition process, such as a plasma chemical vapor deposition process, a low pressure chemical vapor deposition process, or a sub-atmosphere chemical vapor deposition process, etc. A process for removing the initial isolation layer on the base substrate 200 in the body region II may include a planarization process, such as a chemical mechanical polishing process.

In one embodiment, after removing the initial isolation layer on the base substrate 200 in the body region II, the first mask layer 211 may be exposed. When removing the initial isolation layer on the base substrate 200 in the body region II, the first mask layer 211 may protect the top surface of the base substrate 200 from etching loss.

Returning to FIG. 10, after forming the isolation layer, the first mask layer may be removed (S107). FIG. 9 illustrates a corresponding semiconductor structure.

Referring to FIG. 9, after forming the isolation layer 250, the first mask layer 211 (illustrated in FIG. 8) may be removed. A process for removing the first mask layer 211 may include a dry etching process, or a wet etching process, etc. In one embodiment, when removing the first mask layer 211, an etching selection ratio of the first mask layer 211 to the isolation layer 250 may be in a range of approximately 10-20.

In one embodiment, the method for forming the capacitor may also include forming a conductive plug penetrating through the isolation layer 250. The conductive plug may be connected to the electrode layer 240. One end of the conductive plug may be connected to the electrode layer 240, and the other end of the conductive plug may be electrically connected to an interconnection structure above the capacitor.

In the fabrication method for forming the capacitor consistent with disclosed embodiments, the first trench structure and the second trench structure on the first trench structure may be formed in the base substrate in the trench region. The dielectric layer and the electrode layer on the dielectric layer may be formed in the first trench structure. The electrode layer, the dielectric layer and the base substrate may form the capacitor. After forming the isolation layer in the second trench structure, the isolation layer may be formed on the dielectric layer and on the electrode layer, and the bottom surface of the isolation layer may be lower than the top surface of the base substrate in the body region. Therefore, the isolation layer may protect the dielectric layer and the electrode layer. As a result, the electrode layer may not be affected during the subsequent processes, and the electrical performance of the capacitor may be improved.

Correspondingly, a method for forming an image sensor circuit is also provided in the present disclosure. The method may include forming a capacitor. The capacitor may be formed by the methods in the above-described embodiments for forming a capacitor.

The base substrate may include a plurality of body regions, and trench regions between the adjacent body regions. The method for forming the image sensor circuit may also include forming body devices on the base substrate in the body regions, respectively. The isolation layer and the dielectric layer may be adapted to isolate the adjacent body devices.

The method for forming the image sensor circuit consistent with disclosed embodiments may include the methods in the above-described embodiments for forming the capacitor, such that the electrical performance of the image sensor may be improved.

Correspondingly, a capacitor is also provided in the present disclosure. Referring to FIG. 9, the capacitor may include a base substrate 200. The base substrate 200 may include a trench region I and a body region II adjacent to the trench region I. The capacitor may also include a first trench structure and a second trench structure on the first trench structure in the base substrate 200 in the trench region I. In addition, the capacitor may include a dielectric layer 239 and an electrode layer 240 in the first trench structure. The dielectric layer 239 may be formed on a sidewall surface and a bottom surface of the first trench structure, and the electrode layer 240 may be formed on the dielectric layer. Further, the capacitor may include an isolation layer 250 filling the second trench structure. The isolation structure 250 may be formed on the dielectric layer 239 and on the electrode layer 240.

In one embodiment, the isolation layer 250 may be made of silicon oxide. The top surface of the isolation layer 250 may be above the top surface of the base substrate 200 in the body region II. In certain embodiment, the top surface of the isolation layer may be coplanar with the top surface of the base substrate in the body region. In one embodiment, the dielectric layer may be made of silicon oxide, or silicon nitride, etc. The electrode layer may be made of polysilicon.

In the capacitor consistent with disclosed embodiments, the first trench structure and the second trench structure on the first trench structure may be formed in the base substrate in the trench region. The dielectric layer and the electrode layer on the dielectric layer may be formed in the first trench structure. The electrode layer, the dielectric layer and the base substrate may form the capacitor. The isolation layer may be formed in the second trench structure and on the dielectric layer and on the electrode layer, and the bottom surface of the isolation layer may be lower than the top surface of the base substrate in the body region. Therefore, the isolation layer may protect the dielectric layer and the electrode layer. As a result, the electrode layer may not be affected during the subsequent processes, and the electrical performance of the capacitor may be improved.

Correspondingly, an image sensor circuit is also provided in the present disclosure. The image sensor circuit may include a capacitor consistent with above-described embodiments. In the image sensor circuit, the base substrate may include a plurality of body regions, and trench regions between the adjacent body regions. The image sensor circuit may also include body devices, formed on the base substrate in the body regions, respectively. The isolation layer and the dielectric layer may be adapted to isolate the adjacent body devices.

The image sensor circuit consistent with disclosed embodiments may include the above-described capacitor, such that the electrical performance of the image sensor may be improved.

Unlike a conventional capacitor having electrode layers above the semiconductor substrate, the disclosed capacitor may include electrode layers lower than the base substrate in the body region to protect the electrode layers from being damaged during subsequent processes.

Since the capacitor may have been embedded in the shallow trench isolation (STI), the damage concerns on the capacitor in the STI may be avoided. In one embodiment, the total capacitance and leakage of the capacitor in the present disclosure may be comparable with the conventional capacitors. By using the fabrication method consistent with disclosed embodiments, at least two masks and the related photolithography and etching steps for removing the patterned mask layer and the conductive layer in the body region may be saved, and the production cost of the capacitor may be lowered. The fabrication method consistent with disclosed embodiments may provide better process control, and may not have impact on other devices. The capacitor in the present disclosure may be used in data storage, and in CIS process for global shutter application to improve image distortion and lag.

In the fabrication method for forming the capacitor consistent with disclosed embodiments, the first trench structure and the second trench structure on the first trench structure may be formed in the base substrate in the trench region. The dielectric layer and the electrode layer on the dielectric layer may be formed in the first trench structure. The electrode layer, the dielectric layer and the base substrate may form the capacitor. After forming the isolation layer in the second trench structure, the isolation layer may be formed on the dielectric layer and on the electrode layer, and the bottom surface of the isolation layer may be lower than the top surface of the base substrate in the body region. Therefore, the isolation layer may protect the dielectric layer and the electrode layer. As a result, the electrode layer may not be affected during the subsequent processes, and the electrical performance of the capacitor may be improved.

The method for forming the image sensor circuit consistent with disclosed embodiments may include the methods in the above-described embodiments for forming the capacitor, such that the electrical performance of the image sensor may be improved.

In the capacitor consistent with disclosed embodiments, the first trench structure and the second trench structure on the first trench structure may be formed in the base substrate in the trench region. The dielectric layer and the electrode layer on the dielectric layer may be formed in the first trench structure. The electrode layer, the dielectric layer and the base substrate may form the capacitor. The isolation layer may be formed in the second trench structure and on the dielectric layer and on the electrode layer, and the bottom surface of the isolation layer may be lower than the top surface of the base substrate in the body region. Therefore, the isolation layer may protect the dielectric layer and the electrode layer. As a result, the electrode layer may not be affected during the subsequent processes, and the electrical performance of the capacitor may be improved.

The image sensor circuit consistent with disclosed embodiments may include the above-described capacitor, such that the electrical performance of the image sensor may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a capacitor, comprising:
   providing a base substrate, including a trench region and a body region adjacent to the trench region;
   forming a first trench structure and a second trench structure on the first trench structure, in the base substrate in the trench region, wherein on a top surface of the base substrate, an extension direction of the first trench structure is perpendicular to an extension direction of the second trench structure;
   forming a dielectric layer on a sidewall surface and a bottom surface of the first trench structure and an electrode layer on the dielectric layer in the first trench structure; and
   forming an isolation layer, filling the second trench structure, wherein a top surface of the isolation layer is higher than a top surface of the base substrate and a side surface of the isolation layer is coplanar with the sidewall of the first trench structure.

2. The method according to claim 1, wherein:
   the first trench structure includes one first trench.

3. The method according to claim 2, wherein forming the first trench structure and the second trench structure includes:
   forming a patterned mask layer, wherein the patterned mask layer covers the base substrate in the body region and exposes the base substrate in the trench region;
   performing an anisotropic etching process on the base substrate in the trench region by using the patterned mask layer as a mask to form the first trench structure and the second trench structure; and
   removing the patterned mask layer.

4. The method according to claim 1, wherein:
   the first trench structure includes a plurality of first trenches, and one or more second trenches, wherein the second trenches respectively penetrate each first trench along a direction parallel to the top surface of the base substrate.

5. The method according to claim 4 wherein forming the first trench structure and the second trench structure includes:
   forming an initial trench structure in the base substrate in the trench region, wherein the initial trench structure includes a plurality of first initial trenches and one or more second initial trenches, and the second initial trenches respectively penetrate each first initial trenches along the direction parallel to the top surface of the base substrate; and
   removing portions of the base substrate in the trench region along a direction perpendicular to the top surface of the base substrate to form the first trench structure and the second trench structure.

6. The method according to claim 5, before forming the initial trench structure, further including:
   forming a patterned mask structure on the base substrate, wherein the patterned mask structure covers the base substrate in the body region and exposes portions of the base substrate in the trench region; and
   etching the base substrate in the trench region, using the patterned mask structure as an etch mask to form the initial trench structure.

7. The method according to claim 6, wherein:
   the patterned mask structure includes a first mask layer on the base substrate in the body region and on portions of the base substrate in the trench region, and a second mask layer on the first mask layer.

8. The method according to claim 7, wherein:
   the first mask layer is made of one of silicon nitride, silicon oxide, and silicon oxynitride;
   the second mask layer is made of one of silicon nitride, silicon oxide, and silicon oxynitride; and
   the second mask layer is made of a material different from the first mask layer.

9. The method according to claim 1, wherein:
   the isolation layer is made of silicon oxide.

10. The method according to claim 1, wherein forming the dielectric layer and the electrode layer includes:
    forming the dielectric layer on the sidewall surface and the bottom surface of the first trench structure;
    forming an initial electrode layer on the dielectric layer and the base substrate and in the first trench structure and the second trench structure; and
    removing the initial electrode layer on the base substrate and in the second trench structure to form the electrode layer.

11. The method according to claim 1, wherein:
the dielectric layer is made of one of silicon oxide and silicon nitride; and
the electrode layer is made of polysilicon.

12. The method according to claim 1, further including:
forming a conductive plug, penetrating the isolation layer and connected to the electrode layer.

13. A method for fabricating a capacitor, comprising:
providing a base substrate, including a trench region and a body region adjacent to the trench region;
forming a first trench structure and a second trench structure on the first trench structure, in the base substrate in the trench region;
forming a dielectric layer on a sidewall surface and a bottom surface of the first trench structure and an electrode layer on the dielectric layer in the first trench structure; and
forming an isolation layer, filling the second trench structure, wherein:
the first trench structure includes a plurality of first trenches, and one or more second trenches, wherein the second trenches respectively penetrate each first trench along a direction parallel to a top surface of the base substrate,
forming the first trench structure and the second trench structure includes:
forming a patterned mask structure on the base substrate, wherein the patterned mask structure covers the base substrate in the body region and exposes portions of the base substrate in the trench region, wherein the patterned mask structure includes a first mask layer on the base substrate in the body region and on portions of the base substrate in the trench region, and a second mask layer on the first mask layer;
etching the base substrate in the trench region, using the patterned mask structure as an etch mask to form the initial trench structure
forming an initial trench structure in the base substrate in the trench region, wherein the initial trench structure includes a plurality of first initial trenches and one or more second initial trenches, and the second initial trenches respectively penetrate each first initial trenches along the direction parallel to the top surface of the base substrate;
removing portions of the base substrate in the trench region along a direction perpendicular to the top surface of the base substrate to form the first trench structure and the second trench structure;
removing the first mask layer and the second mask layer above the base substrate in the trench region and the second mask layer above the base substrate in the body region when removing portions of the base substrate in the trench region;
retaining the first mask layer on the top surface of the base substrate in the body region after forming the first trench structure and the second trench structure; and
removing the first mask layer after forming the isolation layer.

14. The method according to claim 13, wherein forming the isolation layer includes:
forming an initial isolation layer in the second trench structure and on the first mask layer; and
removing the initial isolation layer on the first mask layer to form the isolation layer.

15. A method for fabricating an image sensor circuit, comprising:
forming a capacitor, wherein the capacitor is formed by:
providing a base substrate, including a trench region and a body region adjacent to the trench region,
forming a first trench structure and a second trench structure on the first trench structure, in the base substrate in the trench region, wherein on a top surface of the base substrate, an extension direction of the first trench structure is perpendicular to an extension direction of the second trench structure,
forming a dielectric layer on a sidewall surface and a bottom surface of the first trench structure and an electrode layer on the dielectric layer in the first trench structure, and
forming an isolation layer, filling the second trench structure, wherein a top surface of the isolation layer is higher than a top surface of the base substrate and a side surface of the isolation layer is coplanar with the sidewall of the first trench structure.

16. The method according to claim 15, further including:
forming body devices on the base substrate in the body region, wherein the isolation layer and the dielectric layer isolate the adjacent body devices.

17. A capacitor, comprising:
a base substrate, including a trench region and a body region adjacent to the trench region;
a first trench structure and a second trench structure on the first trench structure, in the base substrate in the trench region;
a dielectric layer on a sidewall surface and a bottom surface of the first trench structure and an electrode layer on the dielectric layer in the first trench structure; and
an isolation layer, filling the second trench structure and on the dielectric layer and the electrode layer.

18. The capacitor according to claim 17, wherein:
the isolation layer is made of silicon oxide;
the dielectric layer is made of one of silicon oxide and silicon nitride; and
the electrode layer is made of polysilicon.

19. The capacitor according to claim 17, further including:
a conductive plug, penetrating the isolation layer and connected to the electrode layer.

* * * * *